United States Patent [19]
Chou et al.

[11] Patent Number: 5,863,334
[45] Date of Patent: Jan. 26, 1999

[54] STRENGTH-ENHANCED QUARTZ BOAT

[75] Inventors: Chu-An Chou; Ching-Shou Lee; Nai-Yuan Cheng, all of Hsinchu, Taiwan

[73] Assignee: Winbond Electronics Corp., Hsinchu, Taiwan

[21] Appl. No.: 882,134

[22] Filed: Jun. 25, 1997

[30] Foreign Application Priority Data

Jun. 20, 1997 [TW] Taiwan ................................. 86210168

[51] Int. Cl.⁶ ................................................. C23C 16/00
[52] U.S. Cl. ........................................... 118/500; 118/728
[58] Field of Search ..................................... 118/728, 500

Primary Examiner—Richard Bueker

[57] ABSTRACT

A strength-enhanced quartz boat is provided to enhance the strength at connections between the quartz plates and quartz rods of the quartz boat. The strength-enhanced quartz boat includes a front quartz plate, a rear quartz plate, a first pair of quartz rods, a second pair of quartz rods and four reinforcement bars. The first pair of quartz rods are disposed longitudinally to connect the front quartz plate and rear quartz plate at an upper location respectively. The second pair of quartz rods are disposed longitudinally to connect, via first engagement connections, the front quartz plate and rear quartz plate at a lower location respectively. Each reinforcement bar is disposed longitudinally to connect, via a second engagement connection, to one corresponding front quartz plate or rear quartz plate at a location below one corresponding rod of the lower pair of quartz rods. A welding operation is performed on the first engagement connections and the second engagement connections respectively. The welding operation is further performed on a junction between each reinforcement bar and one corresponding rod of the second pair of quartz rods.

12 Claims, 2 Drawing Sheets

STRENGTH-ENHANCED QUARTZ BOAT

FIELD OF INVENTION

The invention relates to a quartz boat, and is particularly concerned with the formation of a strength-enhanced quartz boat.

BACKGROUND OF INVENTION

A quartz boat used as a carrier to support wafers is useful in many processes where a high temperature environment is involved. For instance, in a dry/wet etching process or a thermal treatment process, the wafers are held up by the quartz boat, and then transferred to a chamber or a furnace for further processing. Conventionally the body of the quartz boat 10, as shown in FIG. 1(*a*), includes the following elements.

(1) A front quartz plate 61.

(2) A rear quartz plate 62.

(3) A first pair of quartz rods 63 are disposed longitudinally to connect the front quartz plate 61 and rear quartz plate 62 at an upper location respectively.

(4) A second pair of quartz rods 64 are disposed longitudinally to connect the front quartz plate 61 and rear quartz plate 62 at a lower location respectively. A welding operation is further performed on connections 65 located between the second pair of quartz rods 64, and the front quartz plate 61, and rear quartz plate 62 respectively.

(5) A third pair of quartz rods 66 are disposed substantially vertically to connect to the first pair of quartz rods 63 and second pair of quartz rods 64 at center locations of them respectively.

(6) A fourth quartz rod 68 is disposed horizontally to connect the second pair of quartz rods 64 at center locations thereof respectively.

(7) A plurality of slots 70 cut on the surface of the first pair of quartz rods 63 are provided to accommodate the wafers.

As illustrated in FIG. 1(*b*), in the conventional approach, each of the second pair of quartz rods 64 is connected to the rear quartz plates 62 at connection 65 by welding respectively. When the dry etching process is performed, it is noted that the quartz boat 10 is subjected to a large temperature-transition environment, for example, an environment of temperature transition varying from 180° C. to 25° C. Thus, the strength of the quartz boat 10 at the connections 65 becomes weaker due to such a large temperature transition. In addition, it is observed that the quartz boat 10 is accessed frequently during operation of the dry etching process. In other words, a portion of the quartz boat 10, especially at the connections 65, is subjected to an unavoidably local vibration. This leads to potential damage to the strength especially at the connections 65 of the quartz boat 10. Thus, it is possible that the quartz boat 10 tends to be more easily fragmented and becomes fatigued under the above-mentioned environment. Therefore, it is desirable to enhance the strength of the connections 65, such that the lifetime and reliability of the quartz boat 10 can be increased.

The main object of the instant invention is to provide a cost effective solution to enhance the strength of the quartz boat 10 at the connections between the quartz plates and quartz rods of the quartz boat.

SUMMARY OF INVENTION

A strength-enhanced quartz boat is provided to enhance the strength at connections between the quartz plates and quartz rods of the quartz boat. The strength-enhanced quartz boat has a second pair of quartz rods disposed longitudinally to connect, via a first engagement connections, to front quartz plate and a rear quartz plate at lower locations respectively. Moreover, in order to further improve the strength of the first engagement connections, four reinforcement bars are adopted as auxiliary support to the second pair of quartz rods. Each reinforcement bar is located below one corresponding rod of the second pair of quartz rods and disposed longitudinally to connect, via a second engagement connection, to one corresponding front quartz plate or rear quartz plate respectively. A welding operation realized by heating is performed at the first engagement connections and second engagement connections respectively. Afterwards, a welding operation is further performed at a junction between each reinforcement bar and one corresponding rod of the second pair of quartz rods.

BRIEF DESCRIPTION OF THE APPENDED DRAWINGS

FIG. 1(*b*) is a view showing connection 65.

FIG. 2(*b*) is a view of the strength-enhanced quartz boat in which the first engagement connections, the second engagement connections and a junction are illustrated.

Figure 2A:
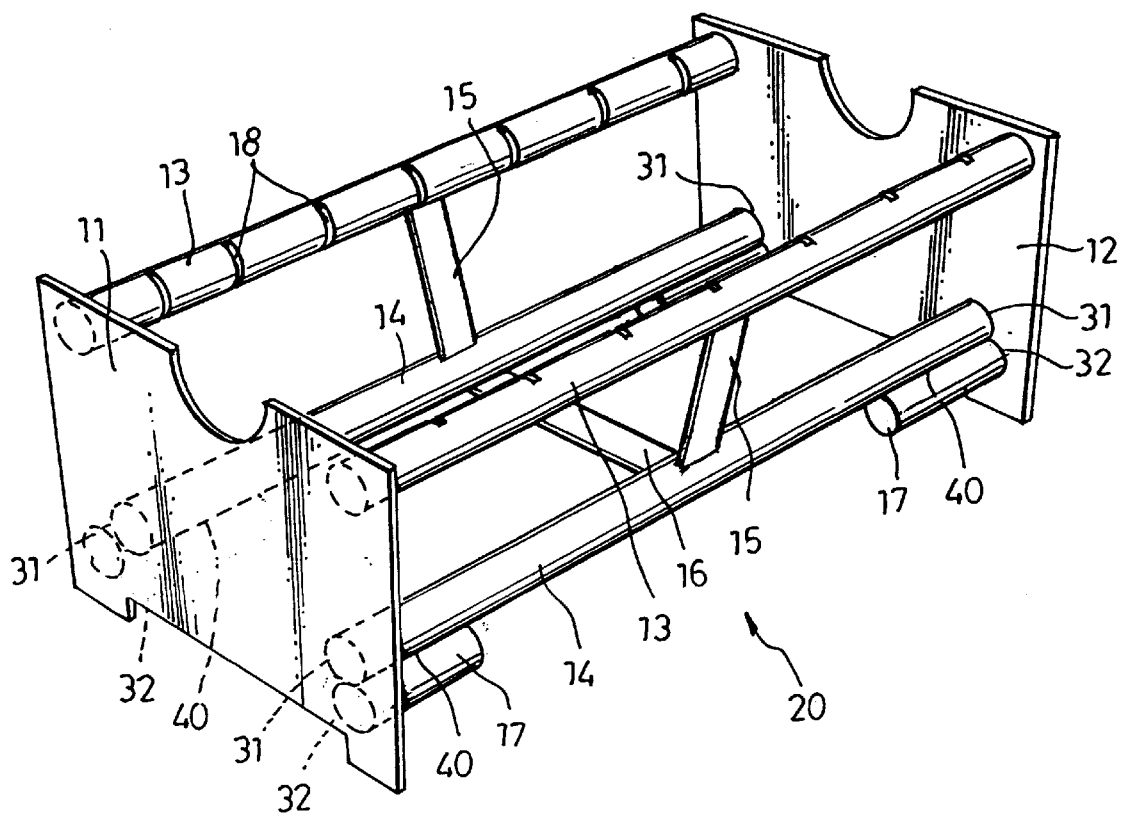
FIG. 2(*a*) illustrates a perspective view of a strength-enhanced quartz boat in accordance with the invention.
Figure 2B:
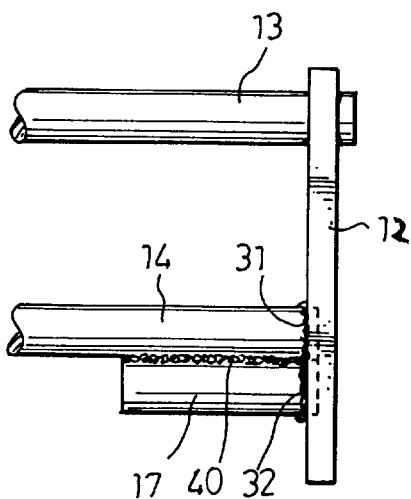
Figure 3:
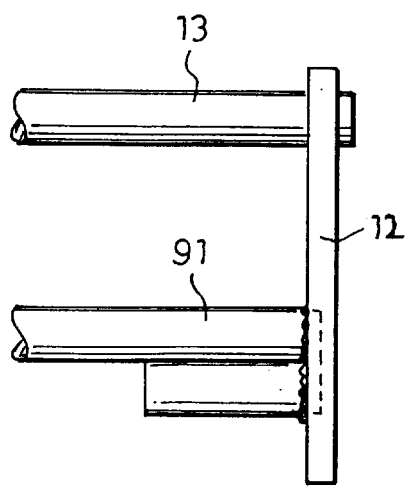

FIG. 3 shows a view of an imaginary integral quartz rod 91 strength-wise equivalent to the combination of quartz rods 14 and 17 of FIG. 2B.

DETAILED DESCRIPTION OF THE INVENTION

A first embodiment of the instant invention will be described below with reference to FIG. 2(*a*) and 2(*b*), to overcome the drawback of possible fragmentation at the first connections 65 of the quartz boat 10 in FIG. 1(*a*) and 1(*b*)

As shown in FIG. 2(*a*), the body of a strength-enhanced quartz boat 20 includes the following elements.

(1) A front quartz plate 11.

(2) A rear quartz plate 12.

(3) A first pair of quartz rods 13 are disposed longitudinally to connect the front quartz plate 11 and rear quartz plate 12 at an upper location respectively.

(4) A second pair of quartz rods 14 are disposed longitudinally to connect, via first engagement connections 31, the front quartz plate 11 and rear quartz plate 12 at a lower location respectively. A welding operation is further performed on the first engagement connections 31.

(5) A third pair of quartz rods 15 are disposed substantially vertically to connect to the first pair and second pair of quartz rods at a center locations thereof respectively.

(6) A fourth quartz rod 16 is disposed horizontally to connect the second pair of quartz rods 14 at center location thereof respectively.

(7) A plurality of slots 18 cut on the surface of the first pair of quartz rods 13 are used to accommodate the wafers.

Figure 1A:
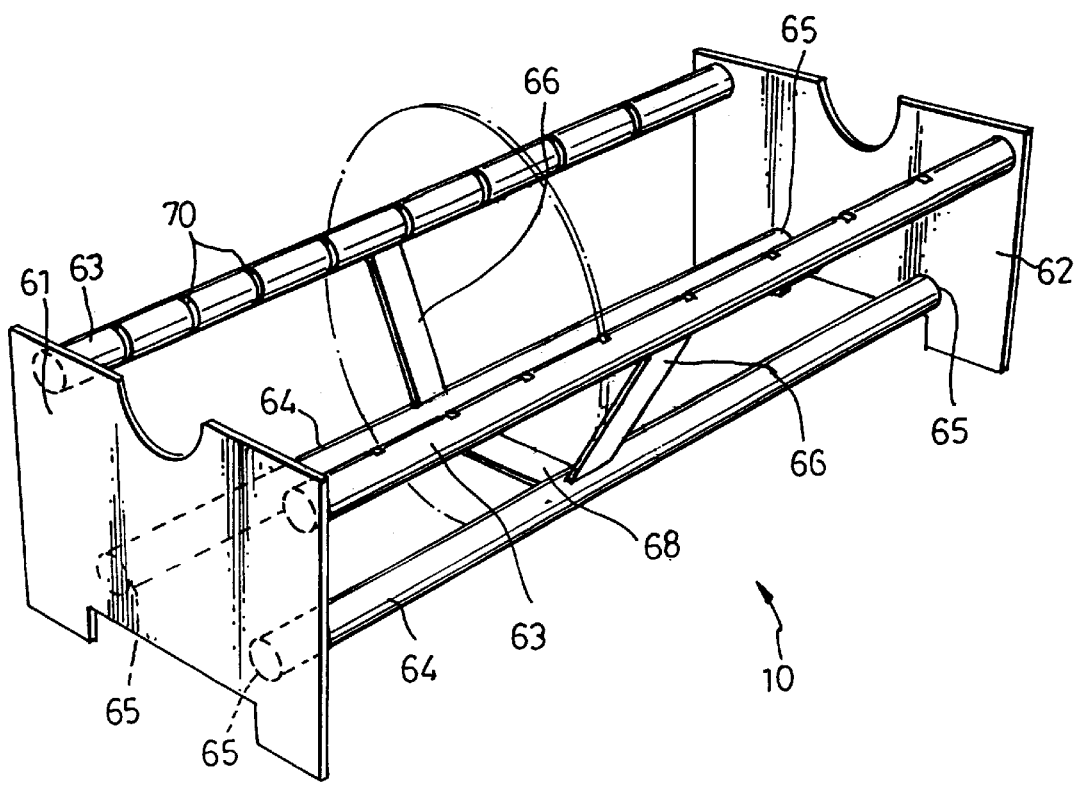
FIG. 1(*a*) illustrates a perspective view of a quartz boat of the prior arts.
Figure 1B:
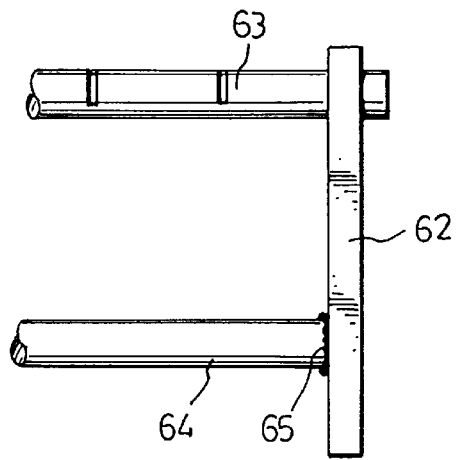

It is observed that the first engagement connections 31 are provided to perform the function of the connections 65 of the conventional quartz boat 10 shown in the FIG. 1(*a*). Through the first engagement connections 31, the second pair of quartz rods 14 are embedded into the front quartz plate 11 and rear quartz plate 12 respectively. Moreover, in order to further improve the strength at the first engagement connections 31, in the second embodiment of the instant invention, four reinforcement bars 17 are adopted as auxiliary supporters to the second pair of quartz rods 14. Each reinforcement bar 17 is disposed longitudinally to connect, via a second engagement connection 32, to one corresponding front quartz plate 11 or rear quartz plate 12 respectively. Each second engagement connection 32 is substantially below and adjacent to one corresponding first connection 31. In a preferred embodiment, each reinforcement bar 17 is located such that the center line of each reinforcement bar 17 is biased outwardly with respect to the center line of the corresponding rod of the second pair of quartz rods 14, as shown in FIG. 2(A). Through provision of the reinforcement bar 17, the strength of the second pair of quartz rods 14 at the first engagement connections 31 is enhanced effectively.

In a preferred embodiment, the length of each reinforcement bar 17 is designed to be shorter than that of the corresponding rod of the second pair of quartz rods 14. Therefore, the strength-enhanced quartz boat 20 is achieved with less quartz material. The magnified view of the connections 31, 32 are depicted in FIG. 2(b).

In a preferred embodiment, a welding operation realized by heating is further performed at the first engagement connections 31 and second engagement connections 32. In a preferred embodiment, a welding operation is further performed at a junction 40 between each reinforcement bar 17 and one corresponding rod of the second pair of quartz rods 14. Hence, the combination of a reinforcement bar 17 with one corresponding rod of the second pair of quartz rods 14, as shown in FIG. 3, behaves, with respect to strength, like an integral quartz rod 91.

We claim:

1. A strength-enhanced quartz boat, comprising:
   a front quartz plate;
   a rear quartz plate;
   a first pair of quartz rods disposed longitudinally to connect the front quartz plate and rear quartz plate at an upper location respectively;
   a second pair of quartz rod disposed longitudinally to connect, via first welded engagement connections, the front quartz plate and rear quartz plate at a lower location respectively ;and
   four reinforcement bars, each disposed longitudinally to connect, via one of a set of second welded engagement connections, to one of the front and rear quartz plates at a location below one of the second pair of quartz rods respectively.

2. The strength-enhanced quartz boat of claim 1, wherein the second set of welded engagement connections are heat welded.

3. The strength-enhanced quartz boat as recited in claim 1, wherein the strength-enhanced quartz boat is adapted for use as a carrier to hold up wafers.

4. The strength-enhanced quartz boat of claim 2, wherein the reinforcement bars are made of quartz.

5. The strength-enhanced quartz boat of claim 1, wherein the length of each reinforcement bar is shorter than that of the one corresponding rod of the second pair of quartz rods.

6. The strength-enhanced quartz boat of claim 1, wherein the first welded engagement connections are heat welded.

7. A strength-enhanced quartz boat comprising a front quartz plate, a rear quartz plate, a first pair of quartz rods disposed longitudinally to connect the front quartz plate and rear quartz plate at an upper location respectively, a second pair of quartz rods disposed longitudinally to connect the front quartz plate and rear quartz plate at a lower location respectively, and four reinforcement bars each disposed longitudinally to connect to one of the front and rear quartz plates at a location adjacent to and below one of the second pair of quartz rods, the strength-enhanced quartz boat being characterized in that:
   the connection of each of the second pair of quartz rods to each of the front quartz plate and rear quartz plate is a welded engagement connection ; and
   the connection of each of the four reinforcement bars to one of the front and rear quartz plates is a welded engagement connection.

8. The strength-enhanced quartz boat as recited in claim 7, wherein the strength-enhanced quartz boat is adapted for use as a carrier to hold up wafers.

9. The strength-enhanced quartz boat of claim 7, wherein the reinforcement bars are made of quartz.

10. The strength-enhanced quartz boat of claim 7, wherein the length of each reinforcement bar is shorter than that of the one corresponding rod of the second pair of quartz rods.

11. The strength-enhanced quartz boat of claim 7, wherein the welded engagement connections of each of the second pair of quartz rods are heat welded.

12. The strength-enhanced quartz boat of claim 7, wherein the welded engagement connection of each of the four reinforcement bars is heat welded.

* * * * *